US012683512B2

(12) United States Patent (10) Patent No.: US 12,683,512 B2

Masuyama (45) Date of Patent: Jul. 14, 2026

(54) ELECTRONIC APPARATUS

(71) Applicant: Mitsubishi Electric Corporation, Tokyo (JP)

(72) Inventor: Takahiro Masuyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 143 days.

(21) Appl. No.: 18/728,988

(22) PCT Filed: Mar. 24, 2022

(86) PCT No.: PCT/JP2022/014116

§ 371 (c)(1),
(2) Date: Jul. 15, 2024

(87) PCT Pub. No.: WO2023/181291

PCT Pub. Date: Sep. 28, 2023

(65) Prior Publication Data

US 2025/0112561 A1 Apr. 3, 2025

(51) Int. Cl.
*H02M 7/00* (2006.01)
*H01G 4/224* (2006.01)
(Continued)

(52) U.S. Cl.
CPC ............ *H02M 7/003* (2013.01); *H01G 4/224* (2013.01); *H01G 4/228* (2013.01); *H05K 7/14329* (2022.08)

(58) Field of Classification Search
CPC .... H05K 7/14329; H01G 4/224; H01G 4/228; H02M 7/003
(Continued)

(56) References Cited

U.S. PATENT DOCUMENTS

| | | | |
|---|---|---|---|
| 9,583,264 B2* | 2/2017 | Kamizuma | ............. H01G 4/224 |
| 2010/0053927 A1* | 3/2010 | Inoue | ........................ H01G 9/28 |
| | | | 361/328 |

(Continued)

FOREIGN PATENT DOCUMENTS

| | | |
|---|---|---|
| CN | 104916431 A | 9/2015 |
| DE | 102012202539 A1 | 8/2013 |

(Continued)

OTHER PUBLICATIONS

Extended European Search Report dated Sep. 22, 2025, issued in the corresponding European Patent Application No. 22933431.3, 10 pages.

(Continued)

*Primary Examiner* — Yemane Mehari

(74) *Attorney, Agent, or Firm* — BUCHANAN, INGERSOLL & ROONEY PC

(57) ABSTRACT

An electronic apparatus includes a base that is planar-shaped, a capacitor, a first planar-shaped member, at least one second planar-shaped member, and fixtures. The capacitor is attached to the first planar-shaped member. The second planar-shaped member is between the first planar-shaped member and the base and has a through-hole for insertion of the capacitor. The fixtures fix the first planar-shaped member to the second planar-shaped member and fix the second planar-shaped member to the base.

12 Claims, 20 Drawing Sheets

(51) Int. Cl.
H01G 4/228 (2006.01)
H05K 7/14 (2006.01)

(58) Field of Classification Search
USPC ........................................................ 363/144
See application file for complete search history.

(56) References Cited

U.S. PATENT DOCUMENTS

2016/0248167 A1* 8/2016 Iso .......................... H01Q 21/08
2018/0019190 A1* 1/2018 Walter ............... H05K 7/14329

FOREIGN PATENT DOCUMENTS

| | | |
|---|---|---|
| JP | S61109131 U | 7/1986 |
| JP | 2002252327 A | 9/2002 |
| JP | 2003283072 A | 10/2003 |
| JP | 2004304101 A | 10/2004 |
| JP | 2005353894 A | 12/2005 |
| JP | 2016158095 A | 9/2016 |
| JP | 2018026543 A | 2/2018 |
| JP | 2019195003 A | 11/2019 |
| JP | 2020181919 A | 11/2020 |

OTHER PUBLICATIONS

International Search Report (PCT/ISA/210) with English translation and Written Opinion (PCT/ISA/237) mailed on Jun. 21, 2022, by the Japanese Patent Office as the International Searching Authority for International Application No. PCT/JP2022/014116, 8 pgs.

Japanese Office Action, Notice of Reason for Refusal with English translation issued in Patent Application No. 2024-509606 dated May 14, 2024, 12 pages.

Office Action dated May 4, 2026, issued in the corresponding Indian Patent Application No. 202427068038. (7 pages).

* cited by examiner

1

45  46                    45  46

42a 62    60

12    12    12

15

12    12    12

20a  45   46        42        45   46

20                                      21a   21

Z

Y ← ⊗ X

ELECTRONIC APPARATUS

TECHNICAL FIELD

The present disclosure relates to an electronic apparatus.

BACKGROUND ART

An electronic apparatus, such as a propulsion controller or a power converter installed on a railway vehicle, includes a housing accommodating multiple electronic components. Patent Literature 1 describes an example of such an electronic apparatus. A power converter described in Patent Literature 1 as an example of such an electronic apparatus includes a base plate attached to a housing, a semiconductor module attached to the base plate, a capacitor attached to the base plate, and a busbar electrically connecting terminals of the capacitor to the semiconductor module.

CITATION LIST

Patent Literature

Patent Literature 1: Unexamined Japanese Patent Application Publication No. 2002-252327

SUMMARY OF INVENTION

Technical Problem

A general-purpose capacitor includes a tubular case with two closed ends accommodating a capacitor element. The case has a first end face receiving the terminals and a second end face receiving other components such as a mount for fixing the capacitor to the base plate. Such a general-purpose capacitor described above may be used for the power converter described in Patent Literature 1.

With the mount facing the base, the capacitor may be attached to the base with the fixtures attached to the mount to reduce vibration of the capacitor under vibration from the traveling railway vehicle. In this case, the busbar that electrically connects the terminals of the capacitor to the semiconductor module attached to the base plate is to be placed without overlapping the fixtures described above and other electronic components. This complicates the structure of the power converter.

In contrast, with the terminals facing the base plate, the capacitor may be attached to the base with the shortest busbar along the base plate to simplify the structure of the power converter. This lengthens the distance of the busbar from the base to the mount and thus causes more vibration of the capacitor under vibration from the travelling railway vehicle. This is common to any electronic apparatus including a capacitor, other than the power converter, in environments under vibration.

Under such circumstances, an objective of the present disclosure is to provide an electronic apparatus with a simple structure with less vibration of a capacitor.

Solution to Problem

To achieve the above objective, an electronic apparatus according to the present disclosure includes a base that is planar-shaped, a capacitor, a first planar-shaped member, at least one second planar-shaped member, and fixtures. The capacitor includes a capacitor element, a case being tubular with two closed ends and accommodating the capacitor element, a plurality of terminals electrically connected to the capacitor element and exposed to outside from a first end face of the case facing the base, and a mount on an outer surface of the case. The capacitor is attached to the first planar-shaped member with the mount. The at least one second planar-shaped member is between the first planar-shaped member and the base and has a through-hole for insertion of the capacitor. The fixtures fix the first planar-shaped member to a second planar-shaped member of the at least one second planar-shaped member and fix the at least one second planar-shaped member to the base.

Advantageous Effects of Invention

The electronic apparatus according to the present disclosure includes the first planar-shaped member to which the capacitor including the multiple terminals facing the base is attached and the fixtures that fix the first planar-shaped member to a second planar-shaped member of the at least one second planar-shaped member and fix the at least one second planar-shaped member to the base. The capacitor is fixed to the base with fixing via the first planar-shaped member, the at least one second planar-shaped member, and the fixtures. This causes less vibration of the capacitor. With the multiple terminals of the capacitor facing the base, the busbar that connects the terminals to electronic components attached to the base are placed in a less complicated manner, simplifying the structure of the electronic apparatus.

3

Figure 15:
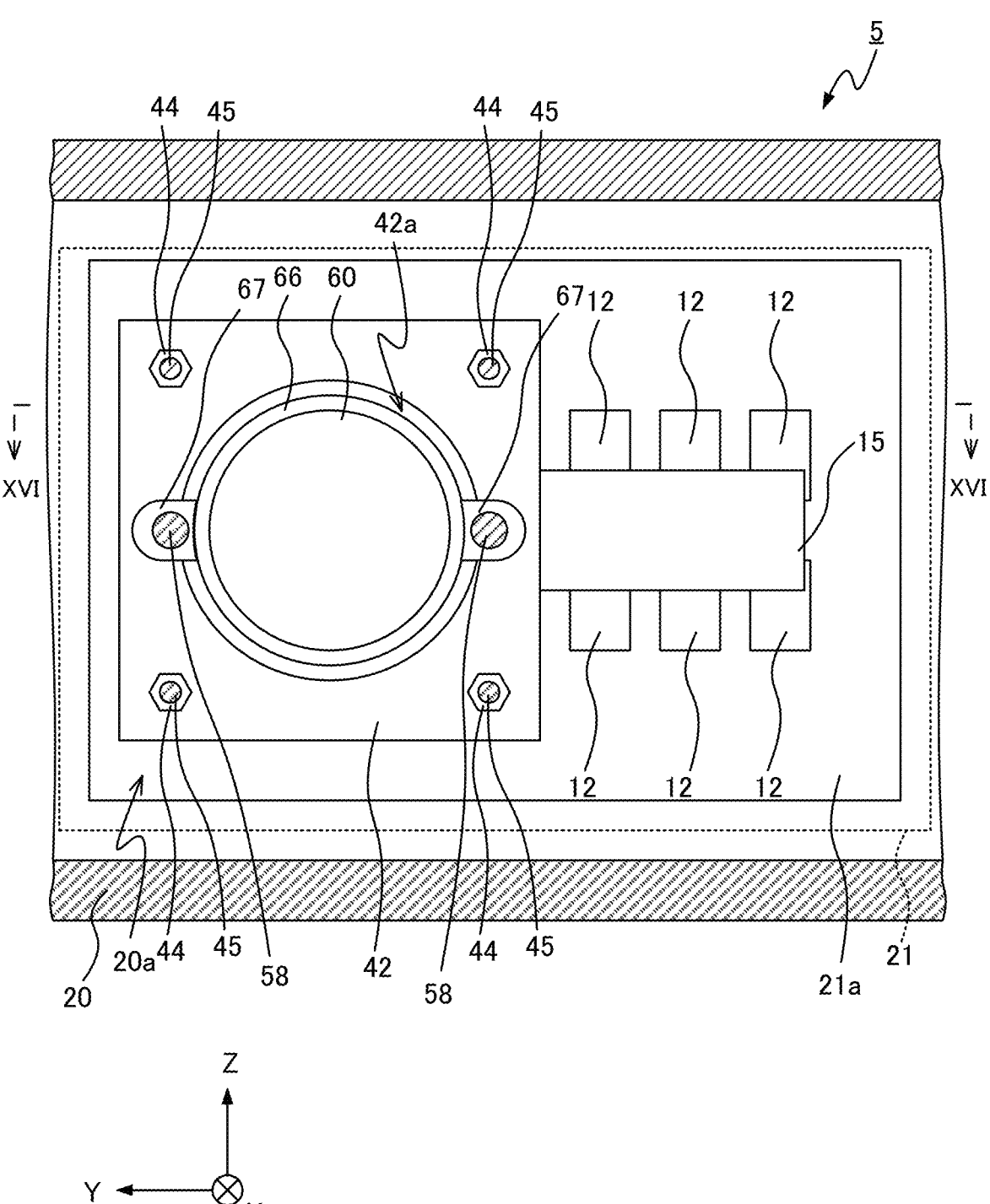
Figure 16:
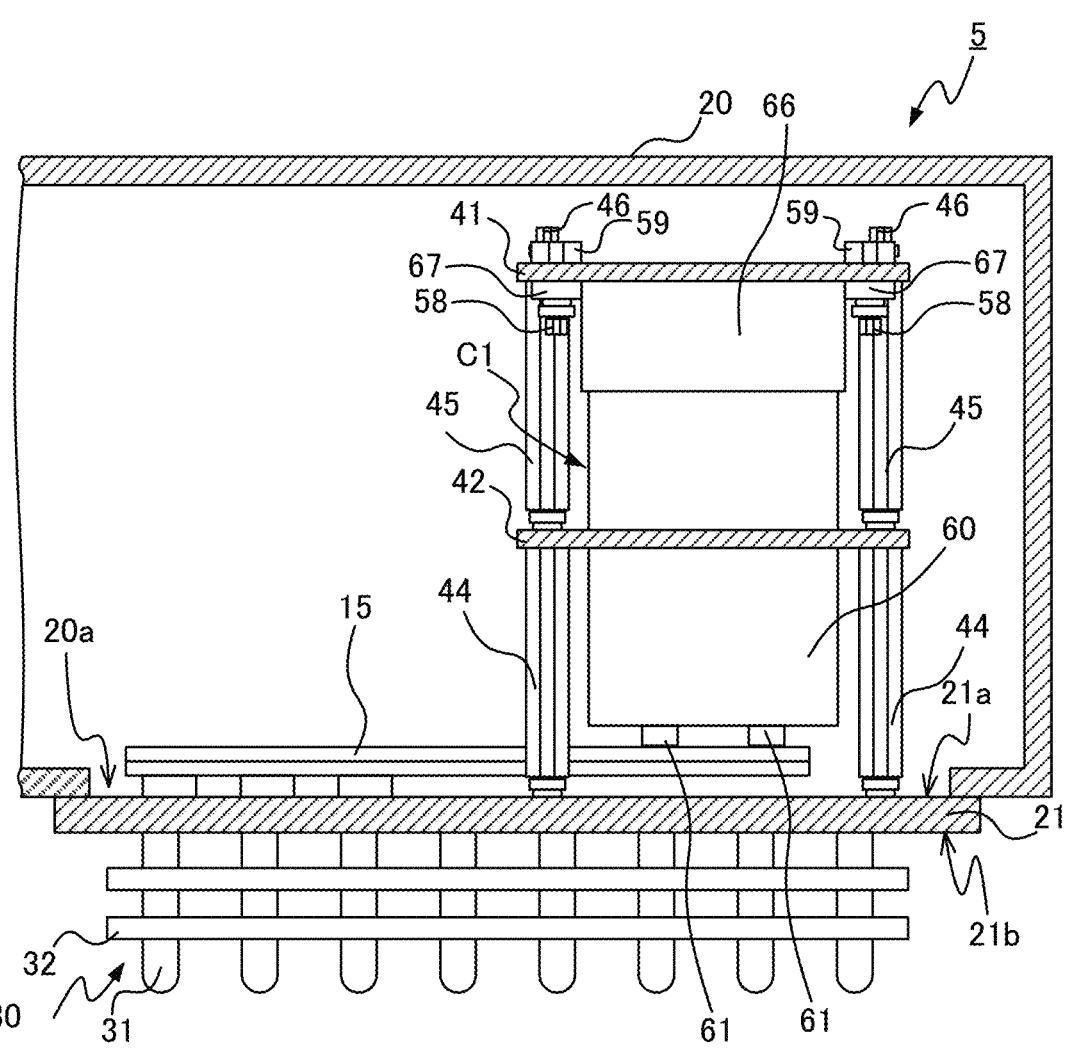
Figure 16:
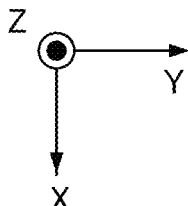
Figure 17:
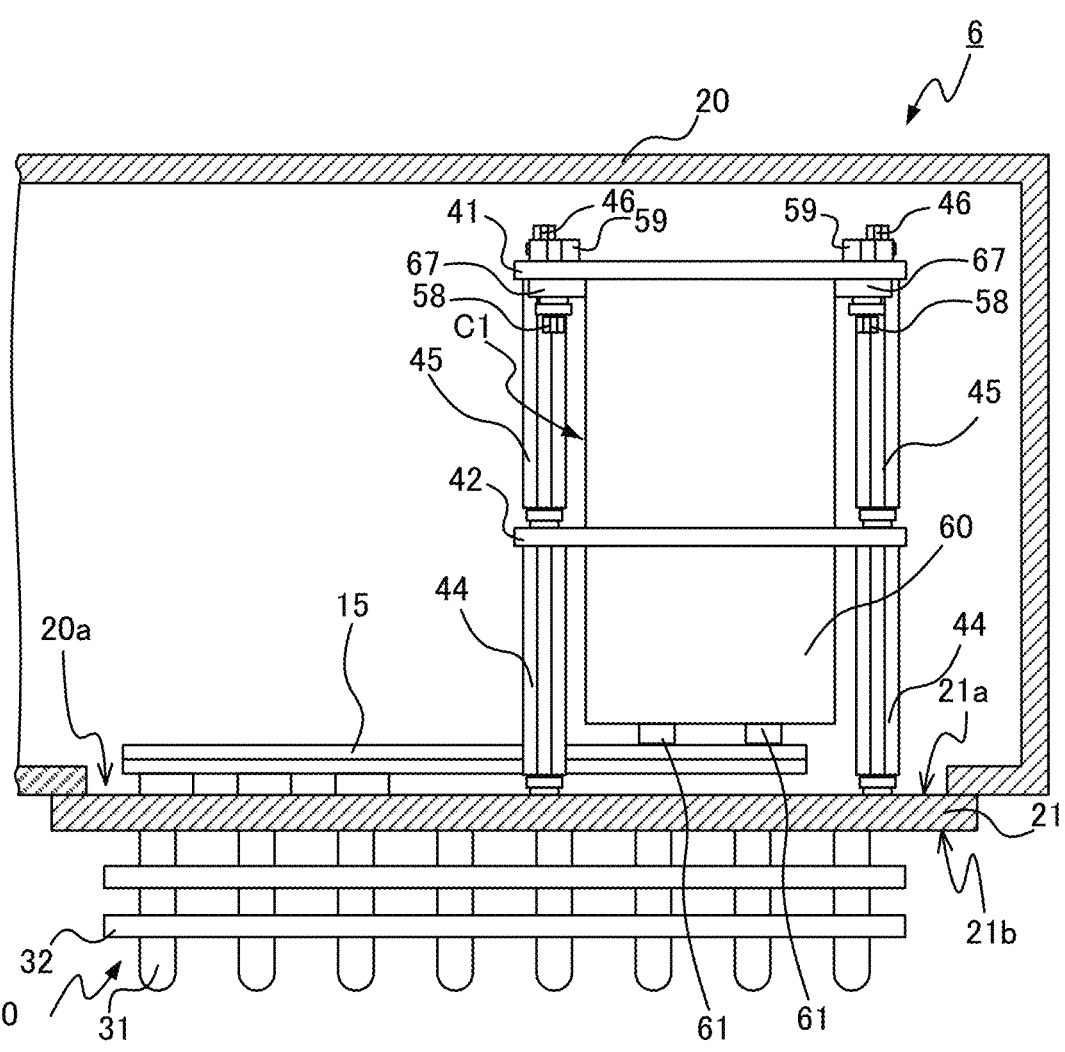
Figure 17:
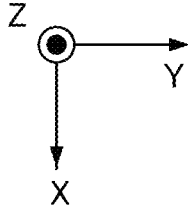
Figure 18:
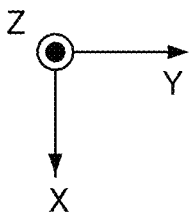
Figure 19:
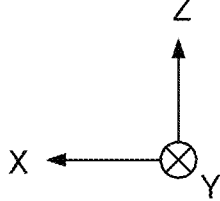
Figure 20:
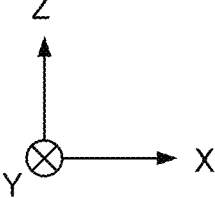

FIG. 15 is a cross-sectional view of an electronic apparatus according to a first modification of an embodiment;

FIG. 16 is a cross-sectional view of the electronic apparatus according to the first modification of the embodiment taken along line XVI-XVI in FIG. 15 as viewed in the direction indicated by the arrows;

FIG. 17 is a cross-sectional view of an electronic apparatus according to a second modification of the embodiment;

FIG. 18 is a cross-sectional view of an electronic apparatus according to a third modification of the embodiment;

FIG. 19 is a cross-sectional view of the electronic apparatus according to the third modification of the embodiment taken along line XIX-XIX in FIG. 18 as viewed in the direction indicated by the arrows; and FIG. 20 is a cross-sectional view of an electronic apparatus according to a fourth modification of the embodiment.

DESCRIPTION OF EMBODIMENTS

An electronic apparatus according to one or more embodiments of the present disclosure is described below in detail with reference to the drawings. In the figures, the same reference signs denote the same or equivalent components.

Embodiment 1

As an example of an electronic apparatus, a direct current (DC) to three-phase alternating current (AC) power converter is installable on a railway vehicle to convert DC power supplied from a DC power supply to AC power to be supplied to a load device and to supply the resulting AC power to the load device. An electronic apparatus 1 according to Embodiment 1 is described using the DC to three-phase AC power converter as an example.

Figure 1:
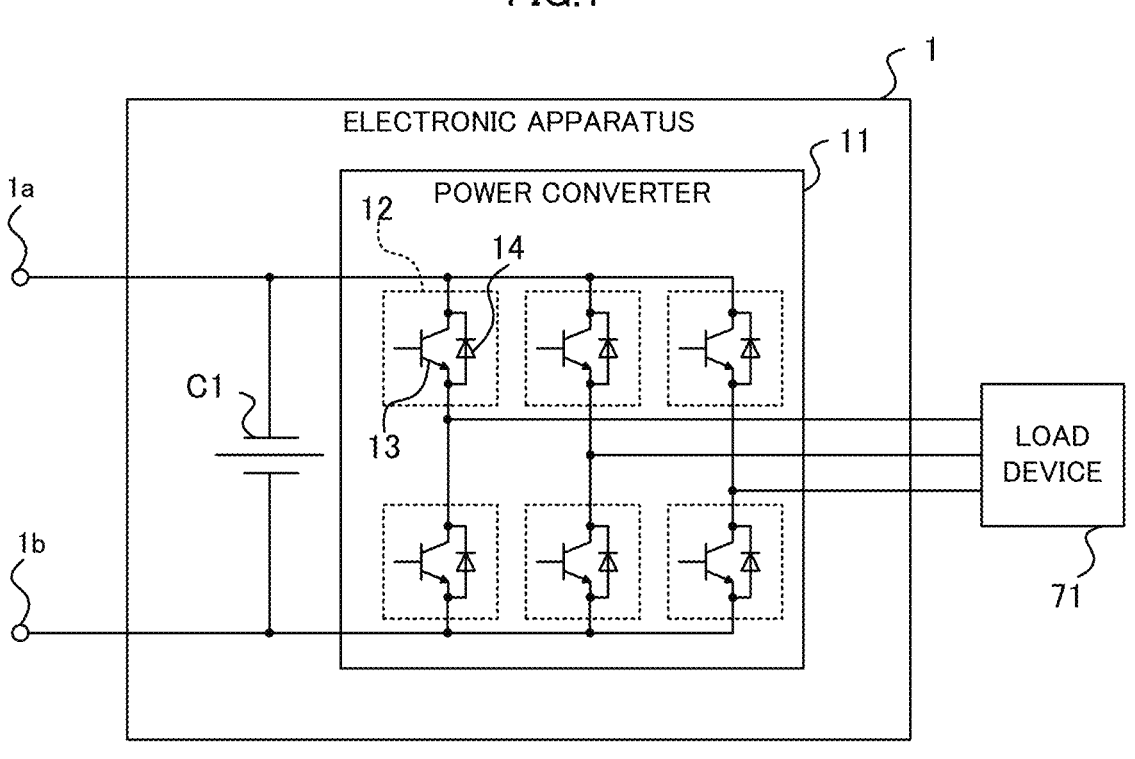
FIG. 1 is a circuit diagram of an electronic apparatus according to Embodiment 1.

The electronic apparatus 1 illustrated in FIG. 1 is installed on a DC feeding railway vehicle to convert supplied DC power to AC power to be supplied to a load device 71 and to supply the AC power to the load device 71. The load device 71 is, for example, a three-phase induction motor that generates propulsion of the railway vehicle.

The electronic apparatus 1 includes a terminal 1a connectable to a power supply through, for example, a non-illustrated contactor and a non-illustrated reactor, a terminal 1b that is grounded, a power converter 11 that converts DC power supplied from the power supply to three-phase AC power and supplies the three-phase AC power to the load device 71, and a capacitor C1 with two ends connected to the terminals 1a and 1b.

The terminal 1a is electrically connectable to, for example, a current collector that acquires DC power supplied from an electrical substation through a power line. The current collector is a power supply that supplies power to the electronic apparatus 1. For example, the power line is an overhead power line or a third rail. The current collector is a pantograph or a current collector shoe. The terminal 1b is short-circuited to a rail through, for example, a ground brush, an earth ring, and a non-illustrated wheel and is grounded.

The power converter 11 includes three pairs of switching elements 12 each connected in series. The three pairs of switching elements 12 correspond to the U phase, the V phase, and the W phase of three-phase AC power. The switching elements 12 corresponding to the U phase, the switching elements 12 corresponding to the V phase, and the switching elements 12 corresponding to the W phase are connected parallel to one another between the terminals 1a and 1b.

A node between the two switching elements 12 corresponding to the U phase, a node between the two switching elements 12 corresponding to the V phase, and a node between the two switching elements 12 corresponding to the W phase are electrically connected to the load device 71.

Each switching element 12 includes an insulated gate bipolar transistor (IGBT) 13 and a reflux diode 14 having an anode connected to an emitter terminal of the IGBT 13 and a cathode connected to a collector terminal of the IGBT 13. A non-illustrated controller provides a gate signal to a gate terminal of the IGBT 13 included in each switching element 12 included in the power converter 11 to turn on or off the switching element 12. Each switching element 12 performs switching to cause the power converter 11 to convert DC power to three-phase AC power and supply the three-phase AC power to the load device 71.

The capacitor C1 is charged with DC power supplied from the power supply. The capacitor C1 forms an inductor-capacitor (LC) filter together with the reactor located in a circuit between the terminal 1a and the power supply to decrease harmonic components generated by switching performed in the power converter 11.

Figure 2:
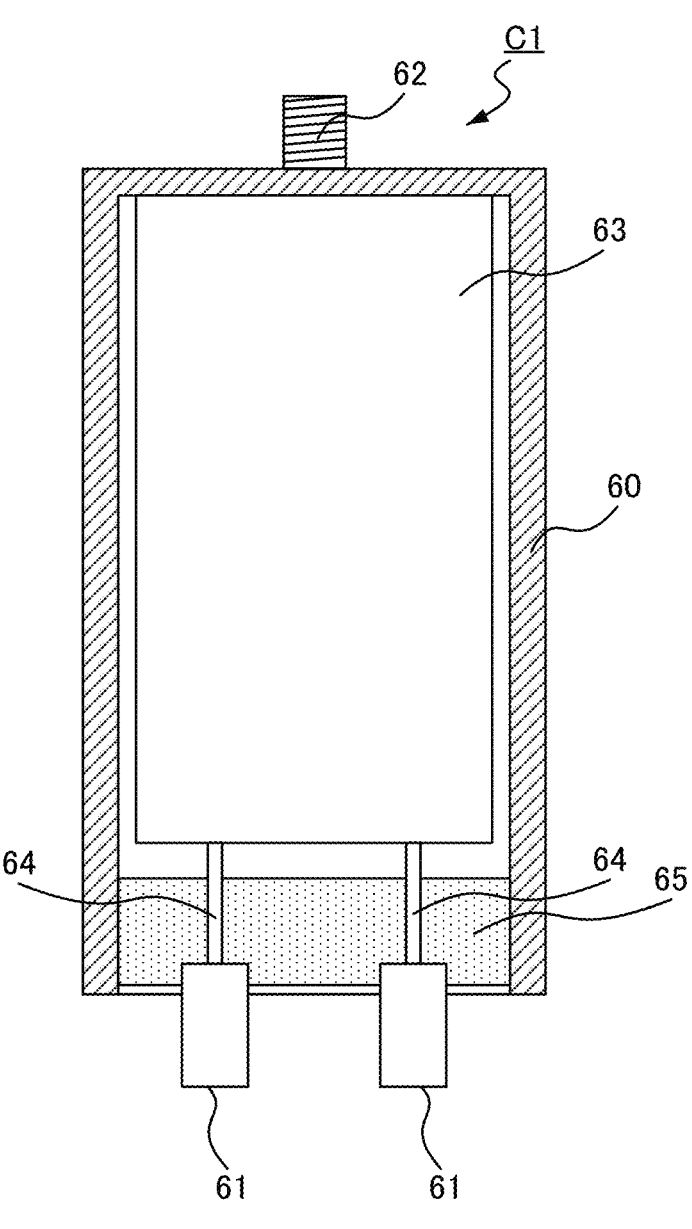
FIG. 2 is a cross-sectional view of a capacitor in Embodiment 1.

The capacitor C1 is a general-purpose capacitor. As illustrated in FIG. 2, the capacitor C1 includes a case 60 being tubular, multiple terminals 61 exposed to outside from a first end face of the case 60, a mount 62 on a second end face of the case 60, a capacitor element 63 accommodated in the case 60, lead tabs 64 electrically connecting the capacitor element 63 and terminals 61, and an insulating sealing member 65 to seal an opening of the case 60.

The case 60 is tubular with the first end face that is open and sealed by the sealing member 65. In other words, the case 60 included in the capacitor C1 is tubular with two closed ends. In an example, the case 60 is a cylindrical metal member formed from, for example, aluminum. The case 60 is insulated from the terminals 61 with the sealing member 65.

In Embodiment 1, the capacitor C1 is a two-terminal capacitor. In other words, the capacitor C1 includes two terminals 61. One terminal 61 is electrically connected to the terminal 1a and the switching elements 12 in upper arms for the U phase, the V phase, and the W phase included in the power converter 11 illustrated in FIG. 1. The other terminal 61 is electrically connected to the terminal 1b and the switching elements 12 in lower arms for the U phase, the V phase, and the W phase included in the power converter 11.

As illustrated in FIG. 2, the mount 62 is located on the closed end face of the case 60, or in other words, on the face of the case 60 opposite to the face receiving the terminals 61. The mount 62 protrudes from the outer surface of the case 60 in a direction in which the central axis of the case 60 extends. The mount 62 is a threaded protrusion.

The capacitor element 63 includes two electrodes and dielectrics between the two electrodes. For example, the capacitor element 63 is a film capacitor including a dielectric film forming a cathode and a dielectric film forming an anode that are wound.

Each lead tab 64 is a conductor. One lead tab 64 electrically connects one terminal 61 to the cathode of the capacitor element 63. The other lead tab 64 electrically connects the other terminal 61 to the anode of the capacitor element 63.

The sealing member 65 is formed from an insulator such as rubber or a resin. The sealing member 65 seals the opening of the case 60 and insulates the case 60 from the terminals 61.

Figure 3:
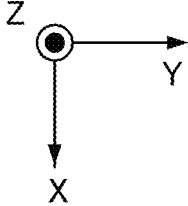
FIG. 3 is a cross-sectional view of the electronic apparatus according to Embodiment 1.

The structure of the electronic apparatus 1 with the above structure is described in detail below. As illustrated in FIG. 3, the electronic apparatus 1 includes a housing 20 accommodating the components, a busbar 15 accommodated in the housing 20 to connect the terminals 61 of the capacitor C1 to the switching elements 12, and a base 21 that is planar-shaped and attached to the housing 20. The electronic apparatus 1 further includes a first planar-shaped member 41 to which the capacitor C1 is attached, a second planar-shaped member 42 having a through-hole for insertion of the capacitor C1, and fixtures that fix the first planar-shaped member 41 to the second planar-shaped member 42 and the second planar-shaped member 42 to the base 21 to fix the capacitor C1 to the base 21.

The electronic apparatus 1 includes, as fixtures, multiple first rod members 44 having first ends attached to the base 21, multiple second rod members 45 having first ends placed through the second planar-shaped member 42 to be attached to the first rod members 44, and multiple first fasteners 46 attaching the first planar-shaped member 41 to second ends of the second rod members 45.

The electronic apparatus 1 preferably further includes a cooling device 30 attached to the base 21 to cool the components in the electronic apparatus 1. For simplicity, in FIG. 3, the terminals 1a and 1b illustrated in FIG. 1 are not illustrated.

With reference to FIG. 3, X-axis extends in the lateral direction of the housing 20, and Y-axis extends in the longitudinal direction of the housing 20. X-axis corresponds to the width direction of a railway vehicle on which the electronic apparatus 1 is installed, and Y-axis corresponds to a direction in which the railway vehicle travels. X-axis, Y-axis, and Z-axis are perpendicular to one another. When the railway vehicle on which the electronic apparatus 1 is installed is located horizontally, Z-axis extends in the vertical direction. The same applies to the subsequent figures.

The housing 20 is attached under the floor of the railway vehicle. The housing 20 has rigidity and strength to resist deformation under the maximum expected vibration from the railway vehicle. For example, the housing 20 is formed from metal such as iron or aluminum. The housing 20 has an opening 20a in the surface intersecting with X-axis.

The base 21 is removably attached to the housing 20 with a first main surface 21a closing the opening 20a of the housing 20. The base 21 may be attached to the housing 20 firmly to maintain a constant relative positional relationship between the base 21 and the housing 20 under vibration from the traveling railway vehicle. More specifically, the base 21 is attached to an outer surface of the housing 20 with an attaching method such as fitting, brazing, welding, attaching with an adhesive, or fastening with a fastening member.

Figure 4:
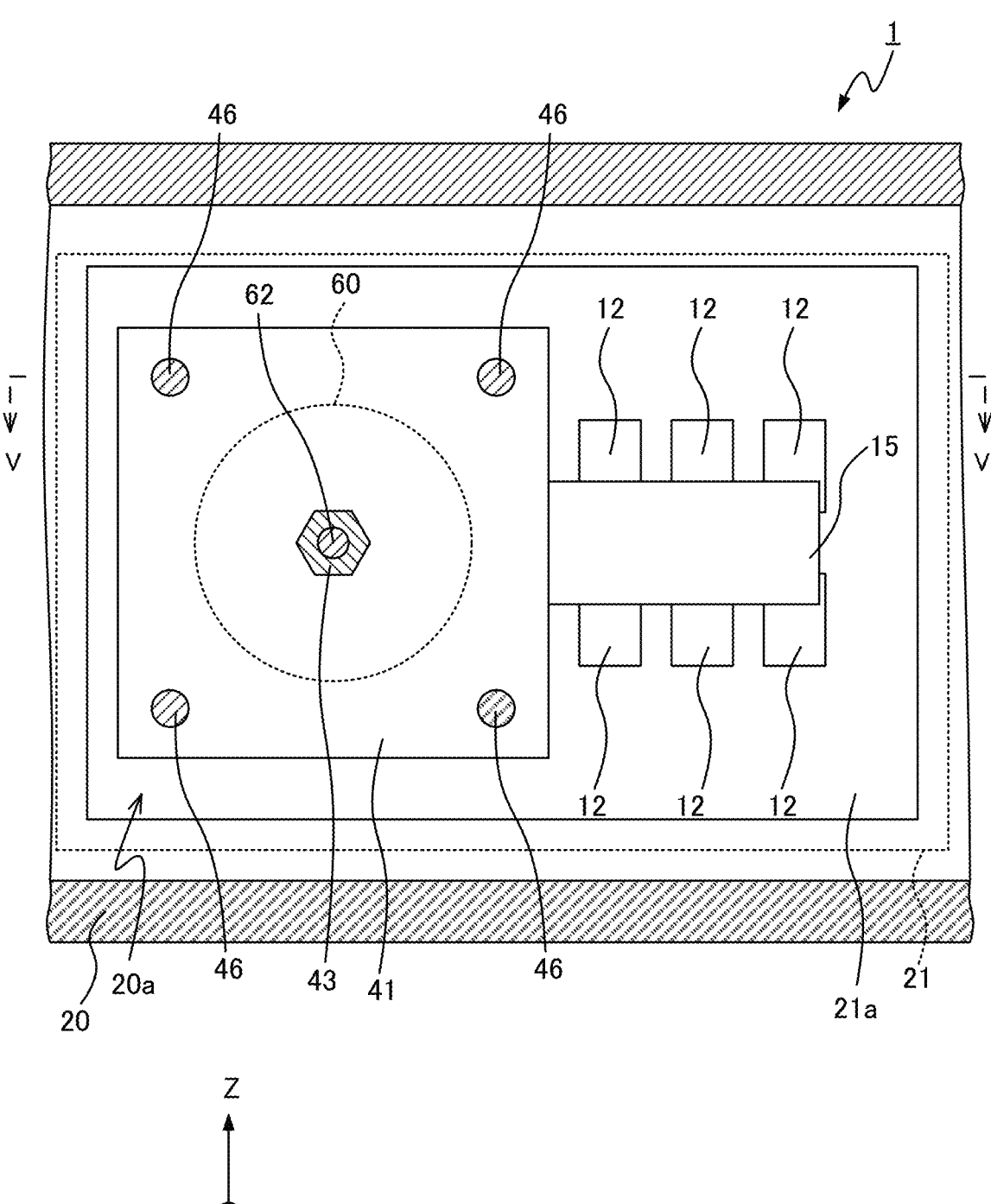
FIG. 4 is a cross-sectional view of the electronic apparatus according to Embodiment 1 taken along line IV-IV in FIG. 3 as viewed in the direction indicated by the arrows.

In Embodiment 1, the base 21 is a thermally conductive planar-shaped member attached to the outer surface of the housing 20 to close the opening 20a. The first main surface 21a of the base 21 receives at least one electronic component that generates heat when receiving power. As illustrated in FIG. 3 and FIG. 4 that is a cross-sectional view taken along line IV-IV in FIG. 3 as viewed in the direction indicated by the arrows, the first main surface 21a of the base 21 receives six switching elements 12. Additionally, the capacitor C1 is fixed to the first main surface 21a of the base 21 with the fixtures described above.

The base 21 is preferably formed from a highly thermally conductive material, for example, metal such as copper or aluminum, that can transfer heat from the switching elements 12 attached to the first main surface 21a to the cooling device 30.

The cooling device 30 is attached to a second main surface 21b opposite to the first main surface 21a to dissipate heat transferred from the switching elements 12 attached to the first main surface 21a. The base 21 is attached to the outer surface of the housing 20 with the switching elements 12 and the capacitor C1 attached to the first main surface 21a, and the cooling device 30 to the second main surface 21b.

The cooling device 30 includes heat pipes 31 attached to the base 21 and multiple fins 32 attached to the heat pipes 31 with the heat pipes 31 extending through the fins 32. Each heat pipe 31 includes a header attached to the base 21 and extending in Y-axis direction, and a branch pipe continuous with the header and extending vertically upward away from the base 21. The header is received in a groove on the base 21, and fixed to the base 21 by, for example, bonding with an adhesive or soldering. The branch pipe is attached to the header by welding or soldering to be continuous with the header.

The header and the branch pipe included in each heat pipe 31 are formed from a highly thermally conductive material, for example, metal such as copper or aluminum. Each heat pipe 31 contains a coolant. The coolant is an object, such as water, that evaporates with heat transferred from the electronic components, and liquefies by dissipating heat into air around the cooling device 30 through the heat pipes 31 and the fins 32.

The fins 32 are flat planar-shaped members and are attached to the heat pipes 31 with the main surfaces parallel to the ZY plane. Each fin 32 is formed from a highly thermally conductive material, or for example, metal such as copper or aluminum.

The busbar 15 electrically connects at least one of the terminals 61 of the capacitor C1 to at least one of the electronic components attached to the base 21. More specifically, the busbar 15 electrically connects one terminal 61 to the switching elements 12 in the upper arms for the U phase, the V phase, and the W phase included in the power converter 11 and the other terminal 61 to the switching elements 12 in the lower arms for the U phase, the V phase, and the W phase included in the power converter 11.

The busbar 15 is, for example, a laminate busbar including a laminate of multiple conductors and multiple insulating layers. In Embodiment 1, the busbar 15 has a flat planar shape extending along the first main surface 21a of the base 21.

As illustrated in FIGS. 3 and 4, the capacitor C1 is attached to the first planar-shaped member 41. More specifically, the mount 62 in the capacitor C1 is placed through a through-hole in the first planar-shaped member 41. With the first planar-shaped member 41 in contact with the case 60, the mount 62 is fastened with a nut 43 to attach the capacitor C1 to the first planar-shaped member 41.

As illustrated in FIG. 4, the first planar-shaped member 41 is a planar-shaped member with a square main surface. The first planar-shaped member 41 preferably has rigidity and strength to resist deformation under the maximum expected vibration from the railway vehicle. For example, the first planar-shaped member 41 is a plate having a thickness of 10 mm or more and formed from metal such as iron, stainless steel, or aluminum, or fiber reinforced plastic.

Figure 5:
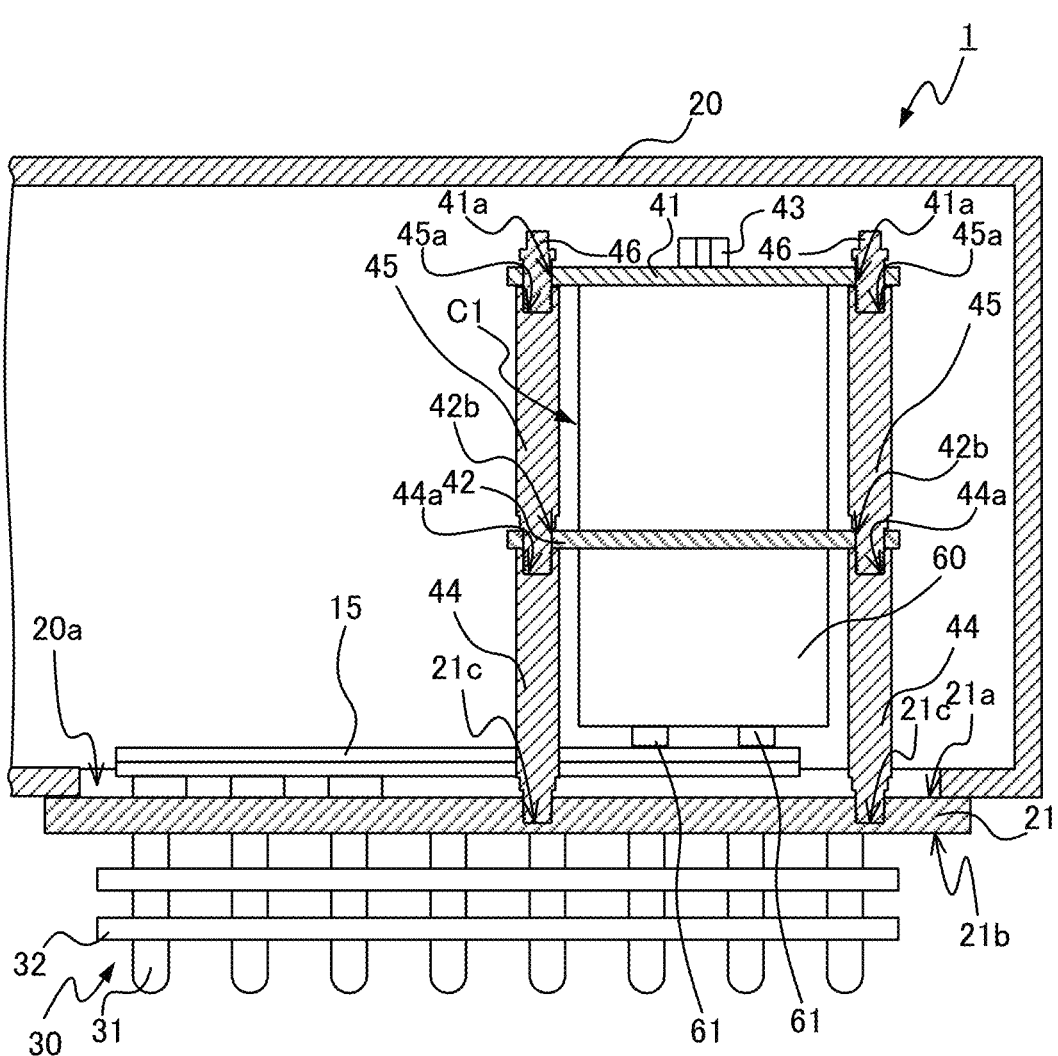
FIG. 5 is a cross-sectional view of the electronic apparatus according to Embodiment 1 taken along line V-V in FIG. 4 as viewed in the direction indicated by the arrows.
Figure 5:
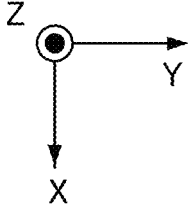

As illustrated in FIG. 5 that is a cross-sectional view taken along line V-V in FIG. 4 as viewed in the direction indicated by the arrows, the first planar-shaped member 41 has insertion holes 41a for insertion of the first fasteners 46.

Figure 6:
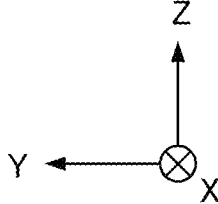
FIG. 6 is a cross-sectional view of the electronic apparatus according to Embodiment 1 taken along line VI-VI in FIG. 3 as viewed in the direction indicated by the arrows.

As illustrated in FIGS. 3 and 5, the second planar-shaped member 42 is located between the first planar-shaped member 41 and the base 21. As illustrated in FIG. 6 that is a cross-sectional view taken along line VI-VI in FIG. 3 as viewed in the direction indicated by the arrows, the second planar-shaped member 42 has a through-hole 42a for insertion of the capacitor C1. The through-hole 42a has an edge facing and spaced from the outer circumferential surface of the case 60.

The second planar-shaped member 42 is a planar-shaped member with a square main surface. The second planar-shaped member 42 preferably has rigidity and strength to resist deformation under the maximum expected vibration from the railway vehicle. For example, the second planar-shaped member 42 is a plate having a thickness of 10 mm or more and formed from metal such as iron, stainless steel, or aluminum, or fiber reinforced plastic.

As illustrated in FIG. 5, the second planar-shaped member 42 has insertion holes 42b for insertion of the second rod members 45.

Figure 7:
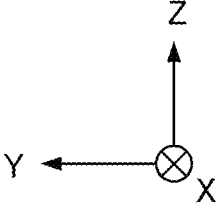
FIG. 7 is a cross-sectional view of the electronic apparatus according to Embodiment 1 taken along line VII-VII in FIG. 3 as viewed in the direction indicated by the arrows.

As illustrated in FIG. 7 that is a cross-sectional view taken along line VII-VII in FIG. 3 as viewed in the direction indicated by the arrows, the electronic apparatus 1 includes four first rod members 44. As illustrated in FIGS. 3 and 5, each first rod member 44 is a hexagonal prism with a tapered and threaded first end. The second end of each first rod member 44 has a first threaded hole 44a. The first threaded hole 44a has a threaded wall. Each first rod member 44 preferably has rigidity and strength to resist deformation under the maximum expected vibration from the railway vehicle. For example, the first rod member 44 is formed from metal such as iron, stainless steel, or aluminum, or fiber reinforced plastic.

The first end of each first rod member 44 is screwed into a hole 21c with a threaded wall located in the base 21. With the first end of each first rod member 44 screwed into the hole 21c, the first rod member 44 is fixed to the base 21.

As illustrated in FIG. 6, the electronic apparatus 1 includes four second rod members 45. As illustrated in FIGS. 3 and 5, each second rod member 45 is, similarly to the first rod member 44, a hexagonal prism with a tapered and threaded first end. Each second rod member 45 has the second end having a second threaded hole 45a. The second threaded hole 45a has a threaded wall. Each second rod member 45 preferably has rigidity and strength to resist deformation under the maximum expected vibration from the railway vehicle. For example, the second rod member 45 is formed from metal such as iron, stainless steel, or aluminum, or fiber reinforced plastic.

The first end of each second rod member 45 is placed through the insertion hole 42b in the second planar-shaped member 42 and screwed into the first threaded hole 44a in the first rod member 44. With the second rod members 45 attached to the first rod members 44 as described above, the second planar-shaped member 42 is fixed to the base 21 via the first rod members 44.

As illustrated in FIG. 4, the electronic apparatus 1 includes the four first fasteners 46. As illustrated in FIG. 5, the first fasteners 46 are placed through the insertion holes 41a in the first planar-shaped members 41 and screwed into the second threaded holes 45a in the second rod members 45. With the first fasteners 46 attached to the second rod members 45 as described above, the first planar-shaped member 41 is fixed to the base 21 via the second rod members 45 and the first rod members 44.

With the fixtures attached to one another as described above, the capacitor C1 is attached to the base 21. More specifically, the capacitor C1 is fixed to the base 21 with fixing via the first planar-shaped member 41, the first fasteners 46, the second rod members 45, and the first rod members 44.

When the railway vehicle is travelling, the housing 20 attached to the vehicle body vibrates. Such vibration of the housing 20 is transmitted to the capacitor C1 through the base 21, the first rod members 44, the second rod members 45, the first fasteners 46, and the first planar-shaped member 41. In the first rod member 44, the second end vibrates with the first end fixed to the base 21 serving as a fulcrum point. The level of vibration of the second end of the first rod member 44 is proportional to the length of the first rod member 44 in a direction in which the first rod member 44 extends. In the second rod member 45, the second end vibrates with the first end fixed to the first rod member 44 serving as a fulcrum point. The level of the vibration of the second end of the second rod member 45 is proportional to the length of the second rod member 45 in a direction in which the second rod member 45 extends.

The length of the first rod member 44 in the direction in which the first rod member 44 extends is shorter than a single member that extends from the mount in the capacitor to the base to fix the capacitor to the base. The length of the second rod member 45 in the direction in which the second rod member 45 extends is also shorter than the single member. The capacitor C1 in the electronic apparatus 1 thus has less vibration than the capacitor fixed to the base with the single member described above.

As described above, in the electronic apparatus 1 according to Embodiment 1, the capacitor C1 is fixed to the base 21 with the fixtures including the first rod members 44, the second rod members 45, and the first fasteners 46. The capacitor C1 fixed to the base 21 with the fixtures described above thus has less vibration.

The capacitor C1 is attached to the base 21 with the terminals 61 facing the base 21. This allows the busbar 15 that connects the terminals 61 to the switching elements 12 attached to the base 21 to be shortest. More specifically, the busbar 15 may have a flat planar shape so as to be placed along the first main surface 21a of the base 21. This simplifies the path on which the busbar 15 is placed, thus simplifying the structure of the electronic apparatus 1. The shortest busbar 15 can lower the parasitic inductance of the busbar 15, as well as the manufacturing cost of the electronic apparatus 1.

With the fixtures formed from conductive metal, the case 60 in the capacitor C1 has the same electric potential as the housing 20. The case 60 in the capacitor C1 is thus grounded when the housing 20 is grounded.

Embodiment 2

The capacitor C1 may be fixed to the base 21 with a structure other than the structure in the above example. Any structure that can fix the capacitor C1 to the base 21 with fixing via multiple members may be used. An electronic apparatus 2 according to Embodiment 2 includes the capacitor C1 fixed to the base 21 with a structure different from the structure in Embodiment 1. The electronic apparatus 2 is described focusing on the differences from the structure in Embodiment 1.

Figure 8:
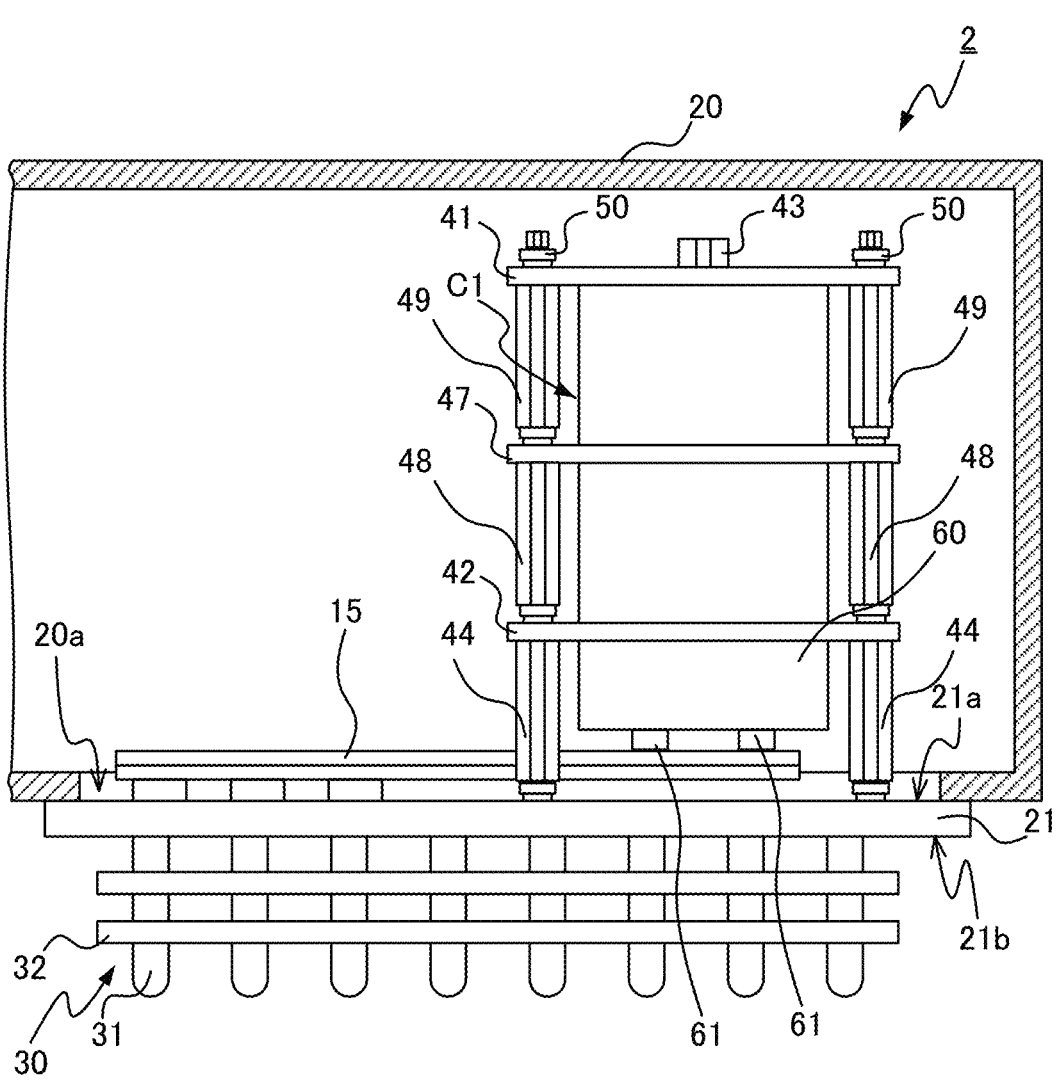
FIG. 8 is a cross-sectional view of an electronic apparatus according to Embodiment 2.
Figure 8:
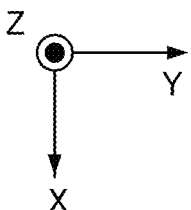

The electronic apparatus 2 illustrated in FIG. 8 includes multiple second planar-shaped members, or a second planar-shaped member 42 and a second planar-shaped member 47. The second planar-shaped members 42 and 47 are located between the first planar-shaped member 41 and the base 21.

Of the second planar-shaped members 42 and 47, the second planar-shaped member 47 is located adjacent to the first planar-shaped member 41.

The electronic apparatus 2 includes, as fixtures, the multiple first rod members 44 having first ends attached to the base 21, multiple third rod members 48 located between the second planar-shaped members 42 and 47, multiple third rod members 49 located between the first planar-shaped member 41 and the second planar-shaped member 47, and multiple second fasteners 50 attaching the first planar-shaped member 41 to the third rod members 49.

The second planar-shaped member 42 and the second planar-shaped member 47 have the same shape. The second planar-shaped member 47 has, similarly to the second planar-shaped member 42, a through-hole for insertion of the capacitor C1. The through-hole has an edge facing and spaced from the outer circumferential surface of the case 60.

The second planar-shaped member 47 is a planar-shaped member with a square main surface. The second planar-shaped member 47 preferably has rigidity and strength to resist deformation under the maximum expected vibration from the railway vehicle. For example, the second planar-shaped member 47 is a plate having a thickness of 10 mm or more and formed from metal such as iron, stainless steel, or aluminum, or fiber reinforced plastic.

Figure 9:
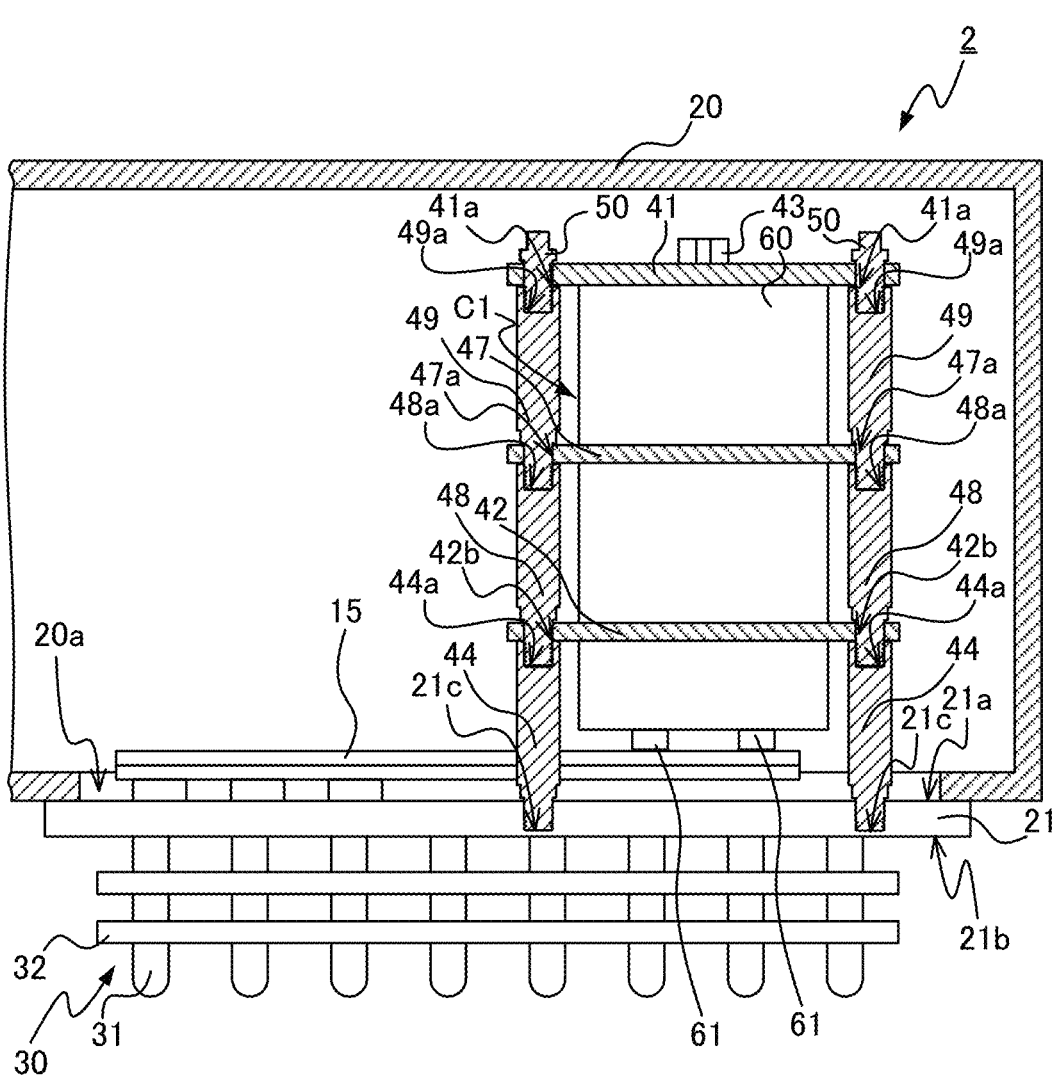
FIG. 9 is a cross-sectional view of the electronic apparatus according to Embodiment 2.
Figure 9:
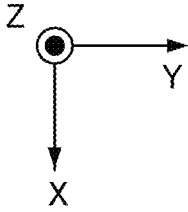

As illustrated in FIG. 9, the second planar-shaped member 47 has insertion holes 47a for insertion of the third rod members 49.

Similarly to Embodiment 1, the electronic apparatus 2 includes four first rod members 44. The electronic apparatus 2 further includes four third rod members 48 having first ends attached to the first rod members 44 and four third rod members 49 having first ends attached to the third rod members 48.

Each third rod member 48 is located between the second planar-shaped members 42 and 47 adjacent to each other. Each third rod member 48 is, similarly to the first rod member 44, a hexagonal prism with a tapered and threaded first end. Each third rod member 48 has a second end having a third threaded hole 48a. The third threaded hole 48a has a threaded wall. Each third rod member 48 preferably has rigidity and strength to resist deformation under the maximum expected vibration from the railway vehicle. For example, the third rod member 48 is formed from metal such as iron, stainless steel, or aluminum, or fiber reinforced plastic.

The first end of each third rod member 48 is placed through the insertion hole 42b in the second planar-shaped member 42 and screwed into the first threaded hole 44a in the first rod member 44. With the third rod members 48 attached to the first rod members 44 as described above, the second planar-shaped member 42 is fixed to the base 21 via the first rod members 44.

The third rod members 49 are located between the first planar-shaped member 41 and the second planar-shaped member 47. Each third rod member 49 is, similarly to the third rod member 48, a hexagonal prism with a tapered and threaded first end. Each third rod member 49 has a second end having a third threaded hole 49a. The third threaded hole 49a has a threaded wall. Each third rod member 49 preferably has rigidity and strength to resist deformation under the maximum expected vibration from the railway vehicle. For example, the third rod member 49 is formed from metal such as iron, stainless steel, or aluminum, or fiber reinforced plastic.

The first end of each third rod member 49 is placed through the insertion hole 47a in the second planar-shaped member 47 and screwed into the third threaded hole 48a in the third rod member 48 adjacent to the third rod member 49. Thus, the third rod member 48 and the third rod member 49 are attached to each other. With the third rod members 49 attached to the third rod members 48 as described above, the second planar-shaped member 47 is fixed to the base 21 via the third rod members 48 and the first rod members 44.

The electronic apparatus 2 includes four second fasteners 50 attached to the third rod members 49. The second fasteners 50 are placed through the insertion holes 41a in the first planar-shaped member 41 and screwed into the third threaded holes 49a in the third rod members 49. With the second fasteners 50 attached to the third rod members 49 as described above, the first planar-shaped member 41 is fixed to the base 21 via the third rod members 49, the third rod members 48, and the first rod members 44.

With the fixtures attached to one another as described above, the capacitor C1 is attached to the base 21. More specifically, the capacitor C1 is fixed to the base 21 with fixing via the first planar-shaped member 41, the first fasteners 50, the third rod members 49, the third rod members 48, and the first rod members 44.

As described above, in the electronic apparatus 2 according to Embodiment 2, the capacitor C1 is fixed to the base 21 with the fixtures including the first rod members 44, the third rod members 48 and 49, and the first fasteners 50. The capacitor C1 fixed to the base 21 with the fixtures described above thus has less vibration. The capacitor C1 in the electronic apparatus 2 is fixed to the base 21 with fixing via a larger number of members than in Embodiment 1, and thus has still less vibration than the capacitor C1 in Embodiment 1.

Embodiment 3

The capacitor C1 may be fixed to the base 21 with a structure other than the structures in the above examples. Any structure that can fix the capacitor C1 to the base 21 with fixing via multiple members may be used. An electronic apparatus 3 according to Embodiment 3 includes the capacitor C1 fixed to the base 21 with a structure different from the structures in Embodiments 1 and 2. The electronic apparatus 3 is described focusing on the differences from the structure in Embodiment 1.

Figure 10:
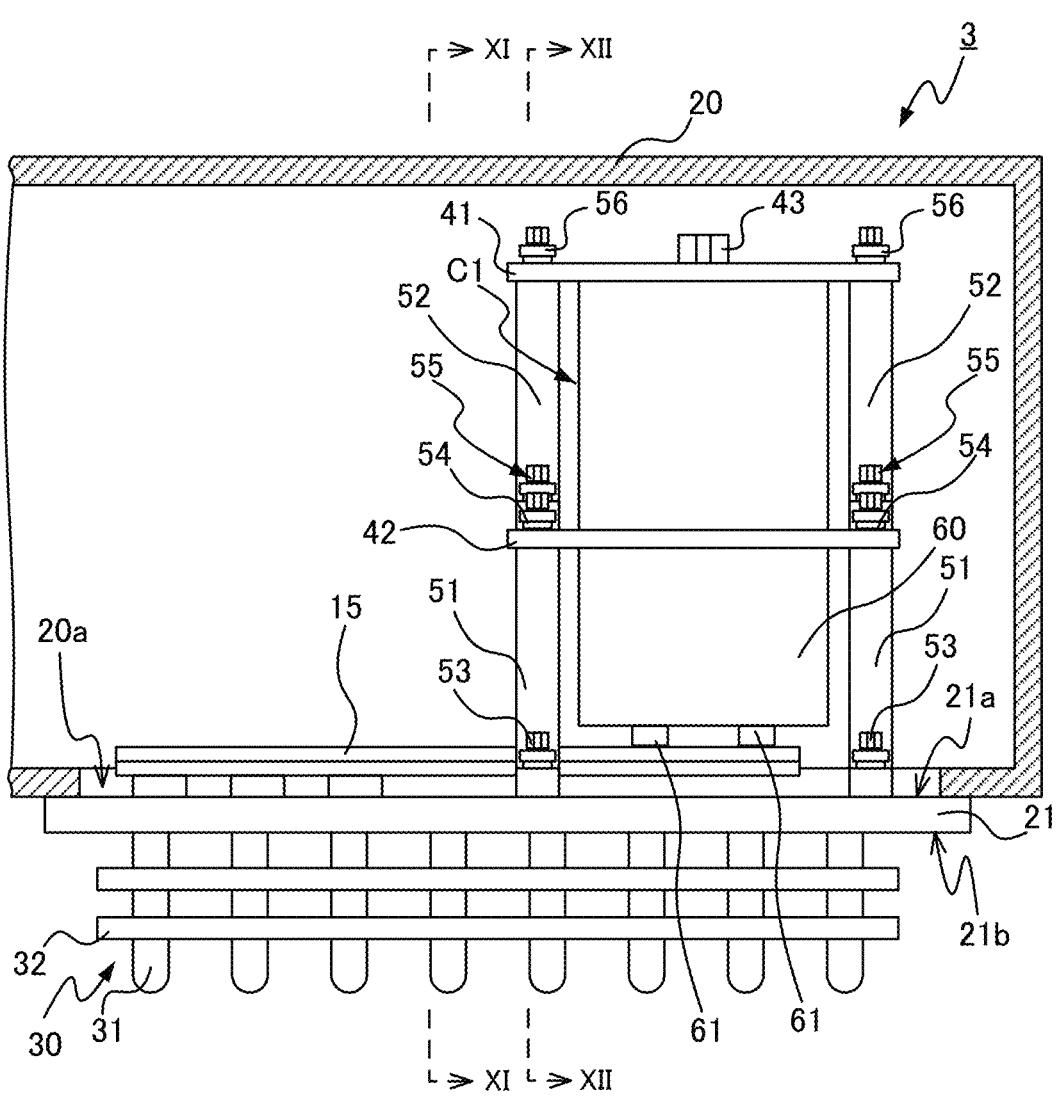
FIG. 10 is a cross-sectional view of an electronic apparatus according to Embodiment 3.
Figure 10:
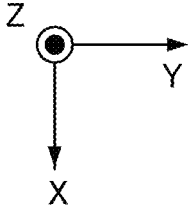
Figure 11:
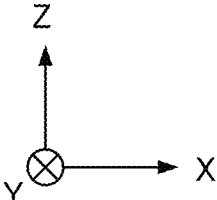
FIG. 11 is a cross-sectional view of the electronic apparatus according to Embodiment 3 taken along line XI-XI in FIG. 10 as viewed in the direction indicated by the arrows.

The electronic apparatus 3 according to Embodiment 3 illustrated in FIG. 10 and FIG. 11 that is a cross-sectional view of the electronic apparatus 3 taken along line XI-XI in FIG. 10 as viewed in the direction indicated by the arrows includes multiple first spacers 51 in contact with the second planar-shaped member 42 and the base 21 and multiple second spacers 52 in contact with the first planar-shaped member 41 and the second planar-shaped member 42.

The electronic apparatus 3 includes, as fixtures, first fastening members 53 fixing the first spacers 51 to the base 21, second fastening members 54 fixing the second planar-shaped member 42 to the first spacers 51, third fastening members 55 fixing the second spacers 52 to the second planar-shaped member 42, and fourth fastening members 56 fixing the first planar-shaped member 41 to the second spacers 52.

The electronic apparatus 3 includes four first spacers 51. Each first spacer 51 is a pillar having a T-shaped cross section perpendicular to Y-axis. The first spacers 51 preferably have rigidity and strength to resist deformation under the maximum expected vibration from the railway vehicle. For example, the first spacers 51 are formed from metal such as stainless steel or aluminum, or fiber reinforced plastic. For example, the first spacer 51 is cut from a metal block.

The electronic apparatus 3 includes two second spacers 52. Each second spacers 52 is a pillar having a T-shaped cross section perpendicular to Y-axis. The second spacers 52 preferably have rigidity and strength to resist deformation under the maximum expected vibration from the railway vehicle. For example, the second spacers 52 are formed from metal such as stainless steel or aluminum, or fiber reinforced plastic. For example, the second spacer 52 is cut from a metal block.

Figure 12:
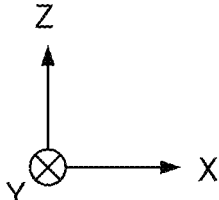
FIG. 12 is a cross-sectional view of the electronic apparatus according to Embodiment 3 taken along line XII-XII in FIG. 10 as viewed in the direction indicated by the arrows.

As illustrated in FIG. 12, the base 21 has holes 21*d* receiving the first fastening members 53. The holes 21*d* each have a threaded wall.

The first planar-shaped member 41 has insertion holes 41*b* for insertion of the fourth fastening members 56. The second planar-shaped member 42 has insertion holes 42*c* for insertion of the second fastening members 54 and insertion holes 42*d* for insertion of the third fastening members 55.

Each first spacer 51 has, in a first end in contact with the base 21, two insertion holes 51*a* for insertion of the first fastening members 53, and, in a second end, a first fastening hole 51*b* receiving the second fastening member 54. For example, the first fastening hole 51*b* has a threaded wall.

Each second spacer 52 has, in a first end in contact with the second planar-shaped member 42, two insertion holes 52*a* for insertion of the third fastening members 55, and have, in a second end, a second fastening hole 52*b* receiving the fourth fastening member 56.

The first fastening members 53 preferably have rigidity and strength to resist deformation under the maximum expected vibration from the railway vehicle. For example, the first fastening members 53 are formed from metal such as iron, stainless steel, or aluminum, or fiber reinforced plastic.

Each first fastening member 53 is, for example, a bolt having a threaded tip and screwed into the corresponding hole 21*d*. More specifically, the first fastening members 53 are placed through the insertion holes 51*a* in the first spacers 51 in contact with the base 21 and screwed into the holes 21*d* in the base 21. The first spacers 51 are thus fixed to the base 21.

The second fastening members 54 preferably have rigidity and strength to resist deformation under the maximum expected vibration from the railway vehicle. For example, the second fastening members 54 are formed from metal such as iron, stainless steel, or aluminum, or fiber reinforced plastic.

Each second fastening member 54 is, for example, a bolt having a threaded tip and screwed into the corresponding first fastening hole 51*b* in the first spacer 51. More specifically, the second fastening members 54 are placed through the insertion holes 42*c* in the second planar-shaped member 42 in contact with the first spacers 51 and screwed into the first fastening holes 51*b* in the first spacers 51. The second planar-shaped member 42 is thus fixed to the first spacers 51. With the second fastening members 54 attached to the first spacers 51 as described above, the second planar-shaped member 42 is fixed to the base 21 via the first spacers 51.

Each third fastening member 55 includes a bolt 55*a* having a threaded tip and a nut 55*b* having an inner circumferential surface into which the bolt 55*a* is screwed. The third fastening members 55 preferably have rigidity and strength to resist deformation under the maximum expected vibration from the railway vehicle. For example, the third fastening members 55 are formed from metal such as iron, stainless steel, or aluminum, or fiber reinforced plastic.

The bolts 55*a* are placed through the insertion holes 52*a* in the second spacers 52 and the insertion holes 42*d* in the second planar-shaped member 42 and then screwed into the nuts 55*b* to fix the second spacers 52 to the second planar-shaped member 42. The second spacers 52 are fixed to the base 21 with fixing via the second planar-shaped member 42 and the first spacers 51.

The fourth fastening members 56 preferably have rigidity and strength to resist deformation under the maximum expected vibration from the railway vehicle. For example, the fourth fastening members 56 are formed from metal such as iron, stainless steel, or aluminum, or fiber reinforced plastic.

Each fourth fastening member 56 is, for example, a bolt having a threaded tip and screwed into the corresponding second fastening hole 52*b* in the second spacer 52. More specifically, the fourth fastening members 56 are placed through the insertion holes 41*b* in the first planar-shaped member 41 and screwed into the second fastening holes 52*b* in the second spacers 52. The first planar-shaped member 41 is thus fixed to the second spacers 52. As described above, with the fourth fastening members 56 attached to the second spacers 52, the first planar-shaped member 41 is fixed to the base 21 via the second spacers 52, the second planar-shaped member 42, and the first spacers 51.

With the fixtures attached to one another as described above, the capacitor C1 is attached to the base 21. More specifically, the capacitor C1 is fixed to the base 21 with fixing via the first planar-shaped member 41, the fourth fastening members 56, the second spacers 52, the third fastening members 55, the second planar-shaped member 42, the second fastening members 54, the first spacers 51, and the first fastening members 53.

As described above, in the electronic apparatus 3 according to Embodiment 3, the capacitor C1 is fixed to the base 21 with the fixtures including the first spacers 51, the second spacers 52, the first fastening members 53, the second fastening members 54, the third fastening members 55, and the fourth fastening members 56. The capacitor C1 in the electronic apparatus 3 including the first spacer 51 and the second spacer 52 thus has less vibration.

Embodiment 4

The capacitor C1 may be fixed to the base 21 with a structure other than the structure in the above example. Any structure that can fix the capacitor C1 to the base 21 with fixing via multiple members may be used. An electronic apparatus 4 according to Embodiment 4 includes the capacitor C1 fixed to the base 21 with a structure different from the structures in Embodiments 1 to 3. The electronic apparatus 4 is described focusing on the differences from the structure in Embodiment 1.

Figure 13:
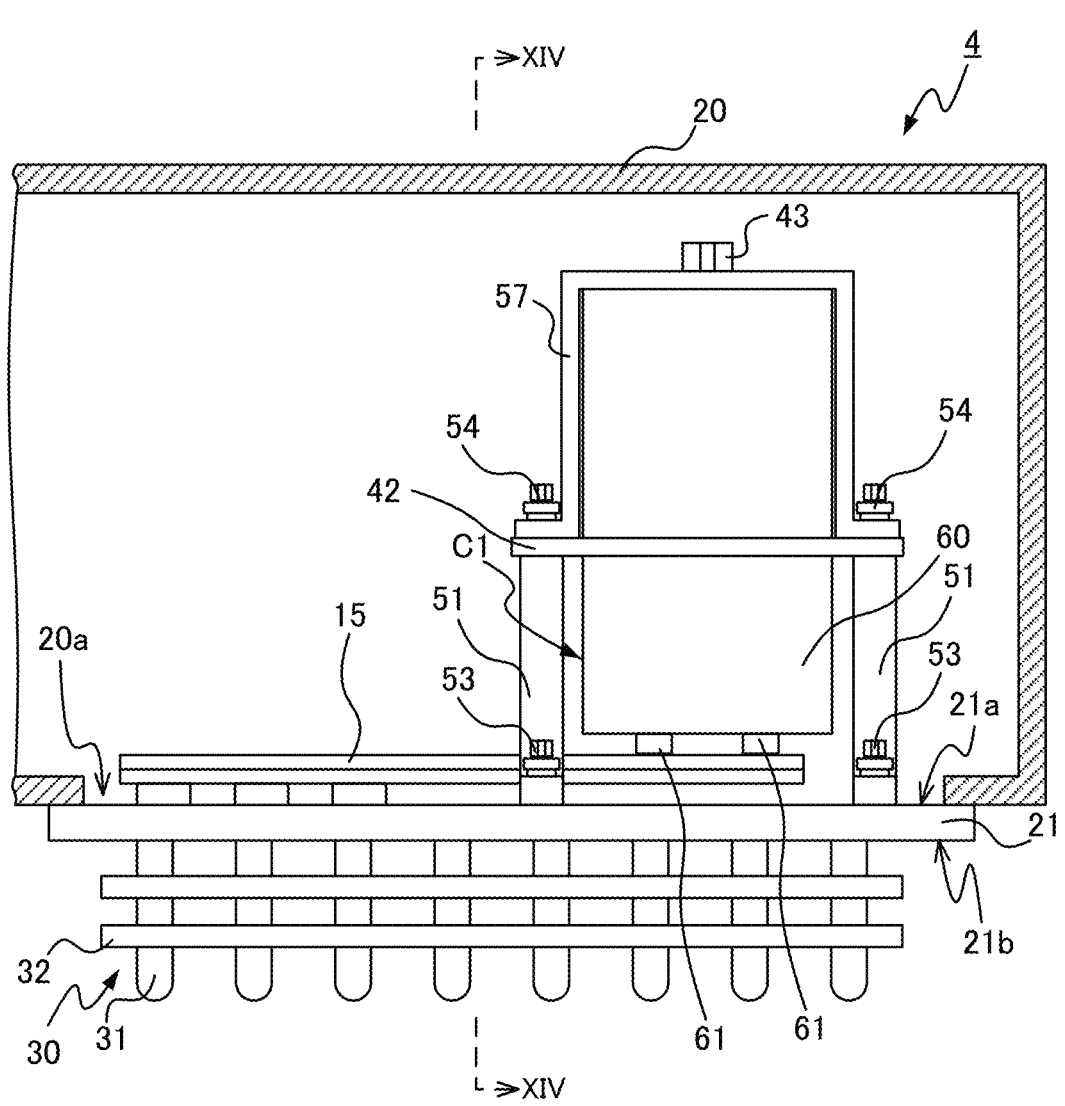
FIG. 13 is a cross-sectional view of an electronic apparatus according to Embodiment 4.
Figure 13:
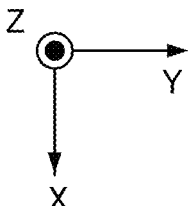

The electronic apparatus 4 according to Embodiment 4 illustrated in FIG. 13 includes, similarly to Embodiment 3, the second planar-shaped member 42 and four first spacers 51 in contact with the base 21. The electronic apparatus 4 includes a first planar-shaped member 57 extending from the second end face of the case 60, or more specifically, the second end face receiving the mount 62, to the base 21.

The electronic apparatus 4 includes, as fixtures, the first fastening members 53 fixing the first spacers 51 to the base 21 and the second fastening members 54 fixing the first planar-shaped member 57 and the second planar-shaped member 42 to the first spacers 51.

Figure 14:
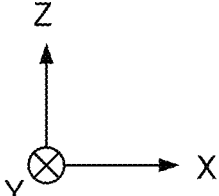
FIG. 14 is a cross-sectional view of the electronic apparatus according to Embodiment 4 taken along line XIV-XIV in FIG. 13 as viewed in the direction indicated by the arrows.

As illustrated in FIGS. 13 and 14, the first planar-shaped member 57 is formed by bending a planar-shaped member.

The first planar-shaped member 57 is partially in contact with the second planar-shaped member 42.

The second fastening members 54 are placed through the first planar-shaped member 57 and the second planar-shaped member 42 in contact with each other and screwed into non-illustrated first fastening holes in the first spacers 51. The first planar-shaped member 57 is thus fixed to the base 21 with fixing via the second planar-shaped member 42 and the first spacers 51.

As described above, in the electronic apparatus 4 according to Embodiment 4, the capacitor C1 is fixed to the base 21 with the fixtures including the first spacers 51, the first fastening members 53, and the second fastening members 54. The capacitor C1 in the electronic apparatus 4 including the first spacers 51 thus has less vibration.

Embodiments of the present disclosure are not limited to the embodiments described above. The multiple embodiments described above may be combined as appropriate. For example, the electronic apparatus 1 may include the first spacers 51 and the first fastening members 53 in place of the first rod members 44. The second rod members 45 may be screwed into the first fastening holes 51b in the first spacers 51.

The capacitor C1 may be fixed to the first planar-shaped member 41 in any manner other than the manner in the above examples. In an example, as illustrated in FIGS. 15 and 16, the capacitor C1 included in an electronic apparatus 5 may include a mount 66 attached to the case 60 to cover the outer circumferential surface of the case 60. The mount 66 includes two protrusions 67 protruding away from the outer circumferential surface of the case 60. The electronic apparatus 5 includes bolts 58 with threaded tips to be placed through the protrusions 67 and the first planar-shaped member 41, and nuts 59 into which the bolts 58 are screwed. With the bolts 58 screwed into the nuts 59, the capacitor C1 is fixed to the first planar-shaped member 41.

In another example as illustrated in FIG. 17, the case 60 in the capacitor C1 included in an electronic apparatus 6 may include two protrusions 67 protruding from the outer circumferential surface of the case 60. The protrusions 67 are integral with the case 60. Similarly to the example in FIGS. 15 and 16, with the bolts 58 placed through the protrusions 67 and the first planar-shaped member 41 and screwed into the nuts 59, the capacitor C1 is fixed to the first planar-shaped member 41.

The electronic apparatuses 1 to 6 each include the single capacitor C1. However, any number of capacitors may be included. An electronic apparatus 7 including multiple capacitors C1 is illustrated in FIGS. 18 and 19. The electronic apparatus 7 includes two capacitors C1 aligned in Y-axis direction. The electronic apparatus 7 includes fixtures similar to those in the electronic apparatus 1. The mount 62 in each capacitor C1 is placed through the first planar-shaped member 41 and fastened with the nut 43 to attach the capacitor C1 to the first planar-shaped member 41. The first planar-shaped member 41 to which the two capacitors C1 are attached is fixed to the base 21 by, similarly to the Embodiment 1, the first rod members 44, the second rod members 45, and the first fasteners 46. The two capacitors C1 are thus fixed to the base 21.

The electronic apparatus 2 may include two or more second planar-shaped members 42 and 47, rather than the two second planar-shaped members as in the above examples. For example, the electronic apparatus 2 may include, in addition to the structure illustrated in FIG. 8, one or more second planar-shaped members 47 and multiple third rod members 48 between the second planar-shaped members 47 adjacent to each other.

The electronic apparatus 3 may include one or more second planar-shaped members 42, rather than the single second planar-shaped member 42 as in the above examples. An electronic apparatus 8 including multiple second planar-shaped members 42 is illustrated in FIG. 20. The electronic apparatus 8 includes multiple second planar-shaped members 42 and multiple second spacers 52 including second spacers 52 in contact with two of the multiple second planar-shaped members 42 adjacent to each other and second spacers 52 in contact with the first planar-shaped member 41 and the second planar-shaped member 42 adjacent to the first planar-shaped member 41.

The first fastening members 53 fix the first spacers 51 to the base 21. The second fastening members 54 fix the second planar-shaped member 42 in contact with the first spacers 51 to the first spacers 51. The third fastening members 55 fix the second spacers 52 to the second planar-shaped member 42 in contact with the second spacers 52. The fourth fastening members 56 fix the first planar-shaped member 41 to the second spacers 52 in contact with the first planar-shaped member 41.

The power converter 11 may have any circuit including switching elements 12 being heat generating electronic components, other than the circuit in each of the above examples.

An elastic member may be located in a space between the through-hole 42a and the case 60. The elastic member avoids contact between the capacitor C1 and the second planar-shaped member 42 when the capacitor C1 vibrates.

Instead of being square, the main surfaces of the first planar-shaped member 41 and the second planar-shaped members 42 and 47 may be rectangular, circular, oval, or in any other shape.

Any capacitor may be used other than the capacitor C1 in each of the above examples. For example, the capacitor C1 may be a three-terminal capacitor.

The shape of the case 60 is not limited with the above examples, and the case 60 may be tubular with a square or rectangular outer shape.

The first fastening members 53, the second fastening members 54, the third fastening members 55, and the fourth fastening members 56 may be fastened to one another with rivets. For fastening with the rivets, the components may not be threaded in the manner described above.

The load device 71 may be any electronic apparatus such as a lightning device or an air conditioning device, other than the electric motor, that receives power from one of the electronic apparatuses 1 to 8 in operation.

The electronic apparatuses 1 to 8 may each include any circuit, other than the circuit in each of the above examples, that includes one or more capacitors C1. In an example, the electronic apparatuses 1 to 8 may each be a power converter that converts AC power supplied from a power supply to AC power to be supplied to the load device 71.

The electronic apparatuses 1 to 8 may each be oriented differently from the above examples. In an example, the electronic apparatuses 1 to 8 may each be attached to the railway vehicle with the first main surface 21a of the base 21 being horizontal. In another example, the electronic apparatuses 1 to 8 may each be attached to the railway vehicle with the first main surface 21a of the base 21 being perpendicular to the travelling direction of the railway vehicle.

The electronic apparatuses 1 to 8 may each be located on the roof of the body of the railway vehicle, rather than under the body of the railway vehicle.

The electronic apparatuses 1 to 8 may each be installable on a AC feeding railway vehicle, rather than on a DC feeding railway vehicle. When one of the electronic apparatuses 1 to 8 is installed on the AC feeding railway vehicle, the current collector may acquire AC power from the electrical substation through the power line, a transformer may lower the voltage of the AC power, and a converter may convert the AC power to DC power. The DC power output from the converter may be supplied to one of the electronic apparatuses 1 to 8.

The electronic apparatuses 1 to 8 may each be installable in any movable body, such as an automobile, an aircraft, or a vessel, rather than a railway vehicle, or located at any location under vibration.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2, 3, 4, 5, 6, 7, 8 Electronic apparatus
1_a_, 1_b_ Terminal
11 Power converter
12 Switching element
13 IGBT
14 Reflux diode
15 Busbar
20 Housing
20_a_ Opening
21 Base
21_a_ First main surface
21_b_ Second main surface
21_c_, 21_d_ Hole
30 Cooling device
31 Heat pipe
32 Fin
41, 57 First planar-shaped member
41_a_, 41_b_, 42_b_, 42_c_, 42_d_, 47_a_, 51_a_, 52_a_ Insertion hole
42, 47 Second planar-shaped member
42_a_ Through-hole
43, 55_b_, 59 Nut
44 First rod member
44_a_ First threaded hole
45 Second rod member
45_a_ Second threaded hole
46 First fastener
48, 49 Third rod member
48_a_, 49_a_ Third threaded hole
50 Second fastener
51 First spacer
51_b_ First fastening hole
52 Second spacer
52_b_ Second fastening hole
53 First fastening member
54 Second fastening member
55 Third fastening member
55_a_, 58 Bolt
56 Fourth fastening member
60 Case

61 Terminal
62, 66 Mount
63 Capacitor element
64 Lead tab
65 Sealing member
67 Protrusion
71 Load device
C1 Capacitor

The invention claimed is:

1. An electronic apparatus comprising:
a base that is planar-shaped;
a capacitor including
    a capacitor element,
    a case accommodating the capacitor element,
    a plurality of terminals electrically connected to the capacitor element, the plurality of terminals being exposed to outside from a first end face of the case, the first end face facing the base, and
    a mount on an outer surface of the case;
a first planar-shaped member to which the capacitor is attached with the mount;
at least one second planar-shaped member between the first planar-shaped member and the base, the at least one second planar-shaped member having a through-hole for insertion of the capacitor; and
fixtures fixing the first planar-shaped member to a second planar-shaped member of the at least one second planar-shaped member and fixing the at least one second planar-shaped member to the base.

2. The electronic apparatus according to claim 1, wherein
the at least one second planar-shaped member is one second planar-shaped member, and
the fixtures include
    a plurality of first rod members having first ends attached to the base,
    a plurality of second rod members having first ends placed through the one second planar-shaped member and attached to the plurality of first rod members, and
    a plurality of first fasteners attaching the first planar-shaped member to second ends of the plurality of second rod members.

3. The electronic apparatus according to claim 2, wherein
the base has holes,
the first ends of the plurality of first rod members are screwed into the holes in the base, and the plurality of first rod members have second ends having first threaded holes,
the first ends of the plurality of second rod members are placed through the one second planar-shaped member and screwed into the first threaded holes in the plurality of first rod members, and the second ends of the plurality of second rod members have second threaded holes, and
the plurality of first fasteners are placed through the first planar-shaped member and screwed into the second threaded holes.

4. The electronic apparatus according to claim 1, wherein
the at least one second planar-shaped member includes a plurality of second planar-shaped members,
the fixtures include
    a plurality of first rod members having first ends attached to the base,
    a plurality of third rod members between adjacent two of the plurality of second planar-shaped members and between the first planar-shaped member and a second planar-shaped member of the plurality of second planar-shaped members located adjacent to the first planar-shaped member, the plurality of third rod members including a third rod member placed through a second planar-shaped member of the plurality of second planar-shaped members and being attached to one another, and a plurality of second fasteners attaching the first planar-shaped member to third rod members of the plurality of third rod members located adjacent to the first planar-shaped member, and third rod members of the plurality of third rod members located adjacent to the plurality of first rod members have first ends placed through a second planar-shaped member of the plurality of second planar-shaped members and attached to the plurality of first rod members.

5. The electronic apparatus according to claim 4, wherein the base has holes, the plurality of first rod members have the first ends screwed into the holes in the base and second ends having first threaded holes, the plurality of third rod members have second ends having third threaded holes, the first ends of the third rod members of the plurality of third rod members located adjacent to the plurality of first rod members are placed through the second planar-shaped member and screwed into the first threaded holes, the first ends of other third rod members of the plurality of third rod members are placed through a second planar-shaped member of the plurality of second planar-shaped members and screwed into the third threaded holes in third rod members of the plurality of third rod members adjacent to the other third rod members, and the plurality of second fasteners are placed through the first planar-shaped member and screwed into the third threaded holes in third rod members of the plurality of third rod members adjacent to the first planar-shaped member.

6. The electronic apparatus according to claim 1, wherein the at least one second planar-shaped member is one second planar-shaped member, the electronic apparatus further comprises a plurality of first spacers in contact with the one second planar-shaped member and the base, the first planar-shaped member has a shape extending from a second end face of the case to the base and is partially in contact with the one second planar-shaped member, and the fixtures include
a plurality of first fastening members fixing the plurality of first spacers to the base, and
a plurality of second fastening members fixing the first planar-shaped member and the one second planar-shaped member to the plurality of first spacers.

7. The electronic apparatus according to claim 1, wherein the at least one second planar-shaped member is one second planar-shaped member, the electronic apparatus further comprises
a plurality of first spacers in contact with the one second planar-shaped member and the base, and a plurality of second spacers in contact with the first planar-shaped member and the one second planar-shaped member, and the fixtures include
first fastening members fixing the plurality of first spacers to the base,
second fastening members fixing the one second planar-shaped member to the plurality of first spacers,
third fastening members fixing the plurality of second spacers to the one second planar-shaped member, and
fourth fastening members fixing the first planar-shaped member to the plurality of second spacers.

8. The electronic apparatus according to claim 1, wherein the at least one second planar-shaped member includes a plurality of second planar-shaped members, the electronic apparatus further comprises
a first spacer in contact with a second planar-shaped member of the plurality of second planar-shaped members and the base, and
a plurality of second spacers including a second spacer in contact with adjacent two of the plurality of second planar-shaped members and a second spacer in contact with the first planar-shaped member and a second planar-shaped member of the plurality second planar-shaped members adjacent to the first planar-shaped member, and the fixtures include
first fastening members fixing the first spacer to the base,
second fastening members fixing a second planar-shaped member of the plurality second planar-shaped members in contact with the first spacer to the first spacer,
third fastening members fixing each second spacer of the plurality of second spacers to a corresponding second planar-shaped member of the plurality of second planar-shaped members in contact with the second spacer, and
fourth fastening members fixing the first planar-shaped member to a second spacer of the plurality of second spacers in contact with the first planar-shaped member.

9. The electronic apparatus according to claim 1, wherein the mount is a protrusion protruding from a second end face of the case.

10. The electronic apparatus according to claim 1, wherein the mount has a shape surrounding an outer circumferential surface of the case and includes a protrusion protruding in a direction away from the outer circumferential surface.

11. The electronic apparatus according to claim 1, wherein the mount is a protrusion protruding from an outer circumferential surface of the case.

12. The electronic apparatus according to claim 1, further comprising:
at least one electronic component that is attachable to the base and is to generate heat when being energized; and
a busbar located along the base to electrically connect at least one of the plurality of terminals to the at least one electronic component.

* * * * *